United States Patent
Kang et al.

(10) Patent No.: US 8,778,601 B2
(45) Date of Patent: Jul. 15, 2014

(54) METHODS OF FORMING PHOTOLITHOGRAPHIC PATTERNS

(75) Inventors: Seokho Kang, Sturbridge, MA (US); Charlotte Cutler, Waltham, MA (US)

(73) Assignee: Rohm and Haas Electronic Materials, Marlborough, MA (US)

( * ) Notice: Subject to any disclaimer, the term of this patent is extended or adjusted under 35 U.S.C. 154(b) by 0 days.

(21) Appl. No.: 13/042,371

(22) Filed: Mar. 7, 2011

(65) Prior Publication Data

US 2011/0159253 A1    Jun. 30, 2011

Related U.S. Application Data

(60) Provisional application No. 61/339,543, filed on Mar. 5, 2010.

(51) Int. Cl.
*G03F 7/26* (2006.01)

(52) U.S. Cl.
USPC ............................................ 430/322; 430/311

(58) Field of Classification Search
USPC ................................. 430/322, 331, 323, 394
See application file for complete search history.

(56) References Cited

U.S. PATENT DOCUMENTS

| | | | |
|---|---|---|---|
| 3,780,357 A | 12/1973 | Haitz | |
| 4,397,938 A | 8/1983 | Desai et al. | |
| 4,454,222 A | 6/1984 | Tada et al. | |
| 5,326,840 A | 7/1994 | Przybilla et al. | |
| 5,813,753 A | 9/1998 | Vriens et al. | |
| 6,056,421 A | 5/2000 | Johnson et al. | |
| 6,504,180 B1 | 1/2003 | Heremans et al. | |
| 6,580,097 B1 | 6/2003 | Soules et al. | |
| 6,653,765 B1 | 11/2003 | Levinson et al. | |
| 6,770,420 B2 | 8/2004 | Dietliker et al. | |
| 6,790,579 B1 | 9/2004 | Goodall et al. | |
| 2002/0172901 A1* | 11/2002 | Tokushima | 430/394 |
| 2005/0243237 A1 | 11/2005 | Sasuga | |
| 2006/0105269 A1* | 5/2006 | Khojasteh et al. | 430/270.1 |
| 2006/0127798 A1* | 6/2006 | Ochiai et al. | 430/270.1 |
| 2006/0172222 A1* | 8/2006 | Sakai et al. | 430/270.1 |
| 2007/0114559 A1 | 5/2007 | Sayers et al. | |
| 2007/0160927 A1 | 7/2007 | Murakami et al. | |
| 2008/0187860 A1* | 8/2008 | Tsubaki et al. | 430/270.1 |
| 2008/0241753 A1* | 10/2008 | Ando | 430/287.1 |
| 2009/0042147 A1 | 2/2009 | Tsubaki | |
| 2009/0268461 A1 | 10/2009 | Deak et al. | |

FOREIGN PATENT DOCUMENTS

| | | |
|---|---|---|
| CN | 2310925 Y | 3/1999 |
| CN | 1372330 A | 10/2002 |
| CN | 1372930 A | 10/2002 |
| DE | 102005058127 | 6/2007 |

(Continued)

OTHER PUBLICATIONS

European Search Report of corresponding European Application No. 11 15 6745.

(Continued)

*Primary Examiner* — Cynthia Kelly
*Assistant Examiner* — Caleen Sullivan
(74) *Attorney, Agent, or Firm* — Jonathan D. Baskin

(57) ABSTRACT

Provided are methods of forming photolithographic patterns using a negative tone development process. Also provided are coated substrates and electronic devices formed by the methods. The methods find particular applicability in the manufacture of electronic devices.

20 Claims, 6 Drawing Sheets

(56) References Cited

FOREIGN PATENT DOCUMENTS

Figure 1A:
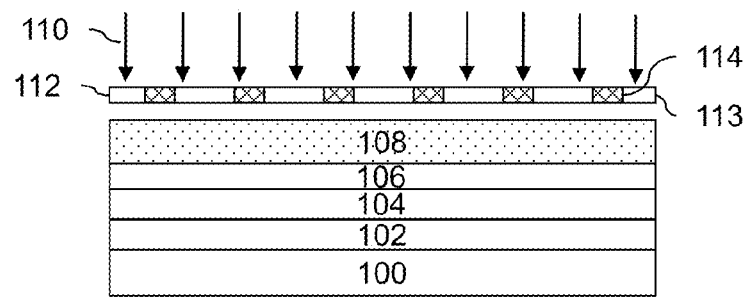

| | | |
|---|---|---|
| DE | 102007022090 | 11/2008 |
| EP | 0 064 222 A2 | 11/1982 |
| EP | 1198005 A1 | 4/2002 |
| EP | 1367655 A1 | 3/2003 |
| EP | 1601030 A2 | 11/2005 |
| EP | 1935452 A1 | 6/2008 |
| JP | 57 173832 | 10/1982 |
| JP | 57 173833 | 10/1982 |
| JP | 10163525 A | 6/1998 |
| JP | 2000164937 | 6/2000 |
| JP | 2000-199953 | 7/2000 |
| JP | 200199953 A | 7/2000 |
| JP | 2000208820 | 7/2000 |
| JP | 2000349346 | 12/2000 |
| JP | 2002118293 A | 4/2002 |
| JP | 20037929 A | 1/2003 |
| JP | 2004031856 | 1/2004 |
| JP | 2004266240 | 9/2004 |
| JP | 2004363342 | 12/2004 |
| JP | 2005252222 | 9/2005 |
| JP | 2006245020 | 6/2006 |
| JP | 2006253370 | 9/2006 |
| JP | 2008153373 A | 7/2008 |
| JP | 2008532281 | 8/2008 |
| TW | 522423 | 3/2003 |
| TW | 595012 | 6/2004 |
| WO | WO2005101445 A1 | 10/2005 |
| WO | WO2005121641 A1 | 12/2005 |
| WO | WO2007107903 A1 | 9/2007 |
| WO | WO2009060356 A2 | 5/2009 |
| WO | WO2010035171 A2 | 4/2010 |
| WO | WO 2010/140709 A1 | 12/2010 |
| WO | WO 2010/147228 A1 | 12/2010 |

OTHER PUBLICATIONS

Musafumi Asano, "Sub-100nm Lithography with KrF Exposure Using Multiple Development Method", Jpn. J. Appl. Phys., 1999, pp. 6999-7003, vol. 38.

V. Truffert, et al, "Ultimate Contact Hole Resolution Using Immersion Lithography With Line/Space Imaging", Proc. of SPIE, Optical Microlithography XXII, 2009, pp. 72740N-1 thru 72740N-12, vo. 7274.

Shinji Tarutani, et al, "Development of materials and processes for negative tone development toward 32-nm node 193-nm immersion double-patterning process", Advanced in Resist Materials and Processing Technology Prof. of SPIE, 2009, pp. 72730C-1 thru 72730C-8, vol. 7273.

Examination Report for European Application No. 04 783 941.0-2203, dated Mar. 22, 2012.

Notification of First Office Action from Chinese Application No. 201010279016.21, dated Feb. 28, 2012.

Notification of the Third Office Action from Chinese Application No. 200780050127.2, dated Mar. 28, 2012.

Decision of Rejection from Japanese Application No. 2009-547218, dated Mar. 8, 2012.

Decision of Rejection from Japanese Application No. 2009-547219, dated Mar. 8, 2012.

Extended European Search Report Application No. 10012027.8-2203/2306526, Mar. 30, 2012.

Office Action for Taiwan Patent Application No. 094122646, Feb. 20, 2012.

Examination Report for European Application No. 08 171 399.2-2222, Mar. 26, 2012.

International Search Report and Written Opinion from Application No. PCT/US2011/001214, dated Mar. 21, 2012.

Notification of the First Office Action, Chinese Patent Application No. 201010279016.2, dated: Feb. 28, 2012.

* cited by examiner

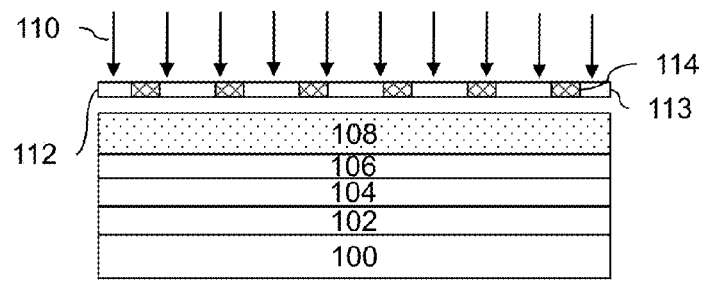
FIG. 2A
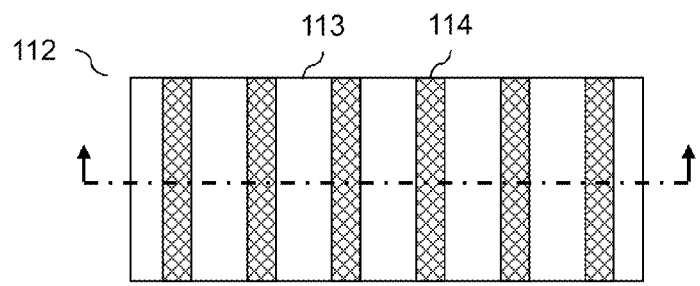
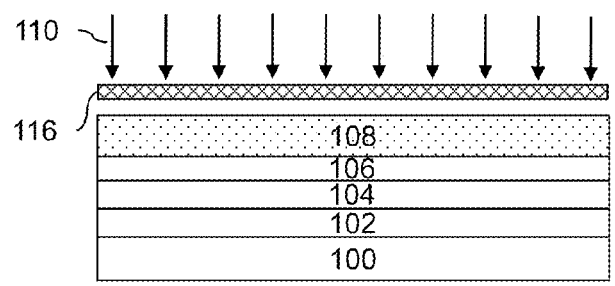
FIG. 2B
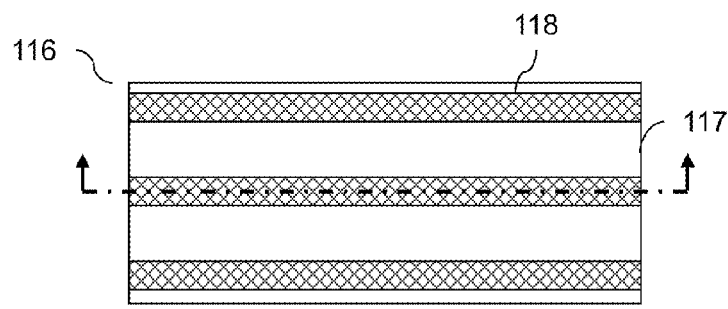

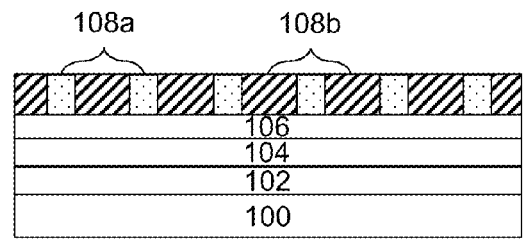
FIG. 2C
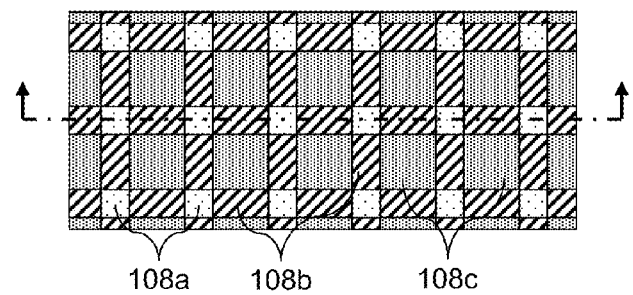
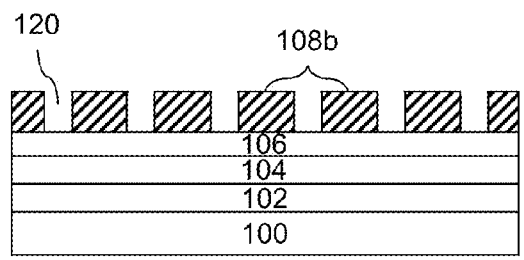
FIG. 2D
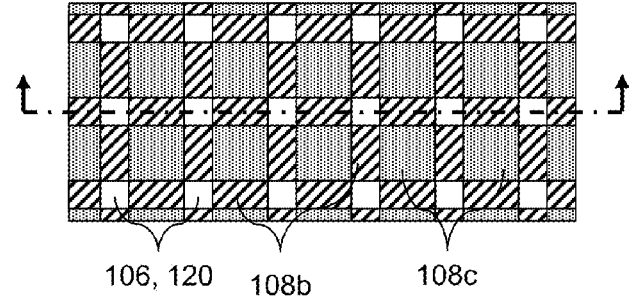

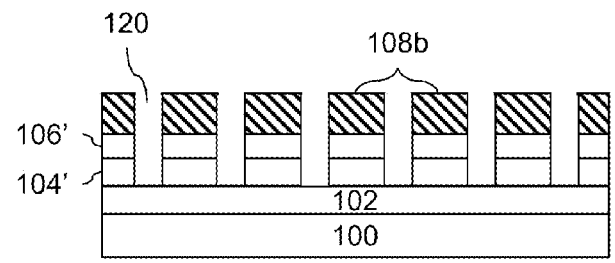
FIG. 2E
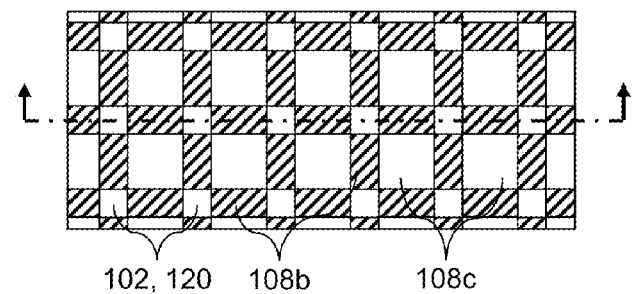
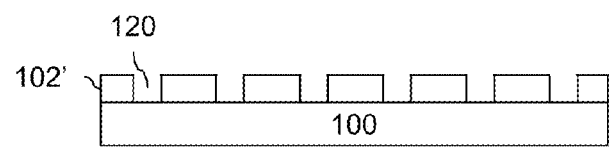
FIG. 2F
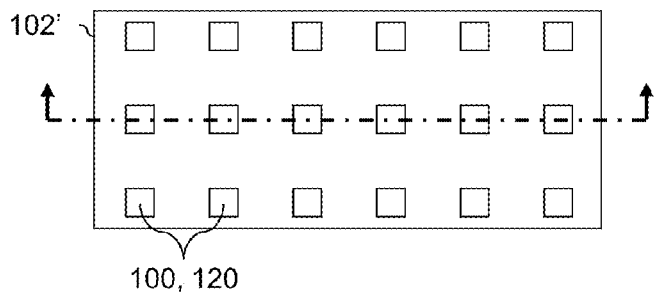

FIG. 4

| 83nm Mask CD Sized to 60nm/110nm Pitch | | | | | | | | | | | | |
|---|---|---|---|---|---|---|---|---|---|---|---|---|
| n-Butyl Acetate Exposure Latitude = 13% | 31.60 76.69 | 32.90 71.14 | 34.20 67.23 | 35.50 63.28 | 36.80 60.72 | 38.10 58.68 | 39.40 56.25 | 40.70 53.64 | 42.00 | 43.30 | | |
| 5-Methyl-2-hexanone Exposure Latitude = 15% | 34.20 | 35.50 | 36.80 63.29 | 38.10 62.45 | 39.40 60.73 | 40.70 | 42.00 | 43.30 | 44.60 | 45.90 | | |
| 2-Heptanone Exposure Latitude = 32% | 45.90 63.36 | 47.20 61.92 | 48.50 | 49.80 | 51.10 | 52.40 58.8 | 53.70 59.64 | 55.00 58.66 | 56.30 56.82 | 57.60 57.1 | | |

METHODS OF FORMING PHOTOLITHOGRAPHIC PATTERNS

CROSS-REFERENCE TO RELATED APPLICATIONS

This application claims the benefit of priority under 35 U.S.C. §119(e) to U.S. Provisional Application No. 61/339,543, filed Mar. 5, 2010, the entire contents of which are incorporated herein by reference.

The invention relates generally to the manufacture of electronic devices. More specifically, this invention relates to photolithographic processes which allow for the formation of fine patterns using a negative tone development process using particular organic materials as a developer.

In the semiconductor manufacturing industry, photoresist materials are used for transferring an image to one or more underlying layers, such as metal, semiconductor and dielectric layers, disposed on a semiconductor substrate, as well as to the substrate itself. To increase the integration density of semiconductor devices and allow for the formation of structures having dimensions in the nanometer (nm) range, photoresists and photolithography processing tools having high-resolution capabilities have been and continue to be developed.

One approach to achieving nm-scale feature sizes in semiconductor devices is the use of short wavelengths of light, for example, 193 nm or less, during exposure of chemically amplified photoresists. Immersion lithography effectively increases the numerical aperture (NA) of the lens of the imaging device, for example, a scanner having a KrF or ArF light source. This is accomplished by use of a relatively high refractive index fluid (i.e., an immersion fluid) between the last surface of the imaging device and the upper surface of the semiconductor wafer. The immersion fluid allows a greater amount of light to be focused into the resist layer than would occur with an air or inert gas medium. When using water as the immersion fluid, the maximum numerical aperture can be increased, for example, from 1.2 to 1.35. With such an increase in numerical aperture, it is possible to achieve a 40 nm half-pitch resolution in a single exposure process, thus allowing for improved design shrink. This standard immersion lithography process, however, is generally not suitable for manufacture of devices requiring greater resolution, for example, for the 32 nm and 22 nm half-pitch nodes.

In an effort to achieve greater resolution and to extend capabilities of existing manufacturing tools, advanced patterning techniques have been proposed, such as double patterning (also referred to as pitch splitting). Various double-patterning techniques, however, suffer from disadvantages which include, for example, one or more of: increased contamination and defectivity due to transport of wafers back and forth between photolithography and etching processing modules, and the etching and resist removal processes themselves; reductions in production throughput due to an increased number of process steps; and resist pattern deformation due to excessively high resist cure temperatures.

Another patterning technique for obtaining fine lithographic patterns involves negative tone development of a traditionally positive-type chemically amplified photoresist. Such resists typically employ a resin having acid-labile groups and a photoacid generator. Exposure to actinic radiation causes the acid generator to form an acid which, during post-exposure baking, causes cleavage of the acid-labile groups in the resin. This creates a difference in solubility characteristics between exposed and unexposed regions of the resist. In the conventional development process using an aqueous alkaline developer such as tetramethylammonium hydroxide (TMAH), exposed regions of the resist are soluble in the developer and are removed from the substrate surface, whereas unexposed regions, which are insoluble in the developer, remain after development to form a positive image. In negative tone development, a negative image can be obtained from the traditionally positive-type resist by development in particular organic solvents. Such a process is described, for example, in U.S. Pat. No. 6,790,579, to Goodall et al. That document discloses a photoresist composition comprising an acid-generating initiator and a polycyclic polymer containing recurring acid labile pendant groups along the polymer backbone. The exposed areas can be selectively removed with an alkaline developer or, alternatively, the unexposed regions can be selectively removed by treatment with a suitable non-polar solvent for negative tone development.

A currently proposed developer for negative tone development is n-butyl acetate (NBA). The use of this materials, however, is not desirable for various reasons. From a safety standpoint, NBA is problematic in that it has a relatively low flashpoint of 22° C. and can pose a fire and explosion hazard since the processing equipment typically has moving mechanical and electrical parts that can produce electrical or static sparks igniting solvent vapor-air mixtures. In addition, exposure latitude when using NBA has been found to be relatively low, thereby providing a lesser than desirable processing window.

There is a continuing need in the art for photolithographic patterning processes which address one or more of the foregoing problems associated with the state of the art and which allow for the formation of fine patterns in electronic device fabrication.

According to a first aspect of the invention, method of forming photolithographic patterns are provided. The methods comprise: (a) providing a substrate comprising over a surface thereof one or more layer to be patterned; (b) applying a layer of a photoresist composition over the one or more layer to be patterned, the photoresist composition comprising a resin comprising an acid cleavable group and an acid generator; (c) patternwise exposing the photoresist composition layer to actinic radiation; and (d) applying a developer to the photoresist composition layer, wherein unexposed portions of the photoresist layer are removed by the developer, leaving a photoresist pattern over the one or more layer to be patterned. The developer comprises 2-heptanone and/or 5-methyl-2-hexanone.

In accordance with a further aspect, provided are electronic devices which are formed by the methods described herein.

In accordance with a further aspect, coated substrates are provided. The coated substrates comprise: a substrate comprising one or more layer to be patterned on a surface thereof; an exposed layer of a photoresist composition over the one or more layer to be patterned, the photoresist composition comprising a resin comprising an acid cleavable group and an acid generator; and a developer solution in contact with the exposed layer of the photoresist composition layer, wherein the developer comprises 2-heptanone and/or 5-methyl-2-hexanone.

Figure 3:
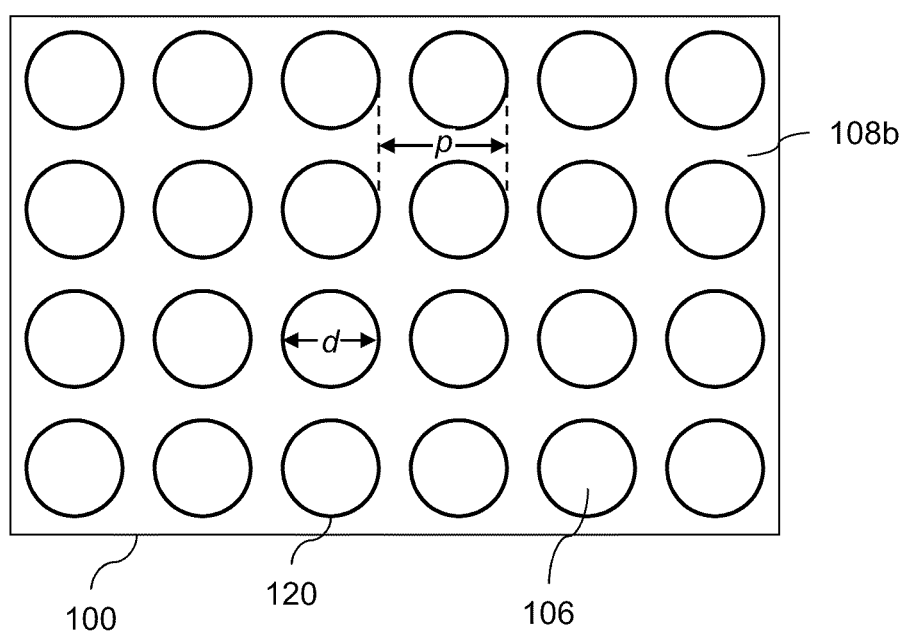

The present invention will be discussed with reference to the following drawings, in which like reference numerals denote like features, and in which:

FIG. 1A-E illustrates an process flow for forming a photolithographic pattern in accordance with a first exemplary aspect of the invention;

FIG. 2A-F illustrates a process flow for forming a photolithographic pattern by double exposure in accordance with a further exemplary aspect of the invention; and FIG. 3 is a top-down view of a patterned substrate in accordance with the invention; and FIG. 4 shows top-down SEM photomicrographs of patterned substrates formed as described in the Examples.

The invention will now be described with reference to FIG. 1A-E, which illustrates a first exemplary process flow for forming a photolithographic pattern by negative tone development in accordance with the invention.

FIG. 1A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102a hard mask layer 104 and/or a bottom antireflective coating (BARC) 106 over which a photoresist layer 108 is to be coated. Use of a hard mask layer 104 may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer 104 can include a single layer or a plurality of layers of different materials. The hard mask layer can be formed, for example, by chemical or physical vapor deposition techniques.

A bottom antireflective coating 106 may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating 106 can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™40A and AR™124 antireflectant materials.

A photoresist composition is applied on the substrate over the antireflective layer 106 (if present) to form a photoresist layer 108. The photoresist composition comprises a resin comprising an acid cleavable group and a photoacid generator. The photoresist composition is a typically positive-acting material when developed in an aqueous alkaline developer, but negative-acting when developed in particular organic developers. Suitable photoresist materials are known in the art and include, for example, those based on acrylate, novolak and silicon chemistries. Suitable resists are described, for example, in U.S. Application Publication Nos. US20090117489 A1, US20080193872 A1, US20060246373 A1, US20090117489 A1, US20090123869 A1 and U.S. Pat. No. 7,332,616. Suitable materials include chemically amplified photoresists which undergo a photoacid-promoted deprotection reaction of acid labile groups of one or more components of the composition to render exposed regions of a coating layer of the resist more soluble in an aqueous developer than unexposed regions. Typical photoacid-labile groups of the photoresist resins include ester groups that contain a tertiary non-cyclic alkyl carbon (e.g., t-butyl) or a tertiary alicyclic carbon (e.g., methyladamantyl) covalently linked to the carboxyl oxygen of the ester. Acetal photoacid-labile groups also are typical.

The resin of the first photosensitive composition preferably has functional groups that impart alkaline aqueous developability to the resist composition. For example, typical are resin binders that comprise polar functional groups such as hydroxyl or carboxylate. The resin component is used in the composition in an amount sufficient to render unexposed regions developable in an organic developer solution. The resin component will typically comprise about 70 to about 97 wt % of total solids of the resist.

The photosensitive composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % of total solids of the resist. Suitable PAGs are known in the art of chemically amplified photoresists and include, for example: onium salts, for example, triphenyl sulfonium salts, nitrobenzyl derivatives, sulfonic acid esters, diazomethane derivatives, glyoxime derivatives, sulfonic acid ester derivatives of an N-hydroxyimide compound and halogen-containing triazine compounds.

The photoresist composition can further include other an added base, particularly tetrabutylammonium hydroxide (TBAH), or tetrabutylammonium lactate, which can enhance resolution of a developed resist relief image. For resists imaged at 193 nm, a typical added base is a hindered amine such as diazabicyclo undecene or diazabicyclononene. The added base is suitably used in relatively small amounts, for example, about 0.03 to 5 wt % relative to the total solids.

Photoresists used in the methods of the invention also may contain a surfactant. Typical surfactants include those which exhibit an amphiphilic nature, meaning that they can be both hydrophilic and hydrophobic at the same time. Amphiphilic surfactants possess a hydrophilic head group or groups, which have a strong affinity for water and a long hydrophobic tail, which is organophilic and repels water. Suitable surfactants can be ionic (i.e., anionic, cationic) or nonionic. Further examples of surfactants include silicone surfactants, poly (alkylene oxide) surfactants, and fluorochemical surfactants. Suitable non-ionic surfactants for use in the aqueous solution include, but are not limited to, octyl and nonyl phenol ethoxylates such as TRITON® X-114, X-100, X-45, X-15 and branched secondary alcohol ethoxylates such as TERGITOL™ TMN-6 (The Dow Chemical Company, Midland, Mich. USA). Still further exemplary surfactants include alcohol (primary and secondary) ethoxylates, amine ethoxylates, glucosides, glucamine, polyethylene glycols, poly(ethylene glycol-co-propylene glycol), or other surfactants disclosed in *McCutcheon's Emulsifiers and Detergents*, North American Edition for the Year 2000 published by Manufacturers Confectioners Publishing Co. of Glen Rock, N.J.

Nonionic surfactants that are acetylenic diol derivatives also can be suitable, including such surfactants of the following formulae:

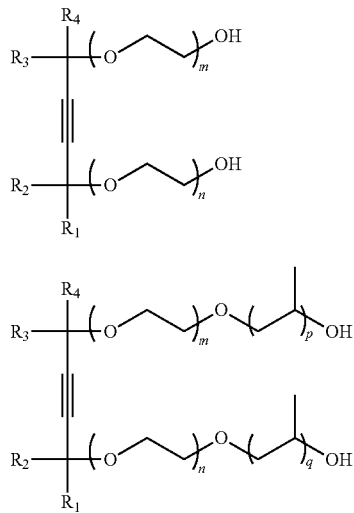

wherein $R_1$ and $R_4$ are a straight or a branched alkyl chain having from 3 to 10 carbon atoms; $R_2$ and $R_3$ are either H or an alkyl chain suitably having from 1 to 5 carbon atoms; and m, n, p, and q are numbers that range from 0 to 20. Such surfactants are commercially available from Air Products and Chemicals, Inc. of Allentown, Pa. trade names of SURFYNOL® and DYNOL®.

Additional suitable surfactants include other polymeric compounds such as the tri-block EO-PO-EO co-polymers PLURONIC® 25R2, L121, L123, L31, L81, L101 and P123 (BASF, Inc.).

The photoresist may include additional optional materials. For example, other optional additives include anti-striation agents, plasticizers and speed enhancers. Such optional additives typically will be present in minor concentrations in a photoresist composition except for fillers and dyes which may be present in relatively large concentrations, for example, in amounts of from about 0.1 to 10 wt % based on the total weight of a resist's dry components.

Photoresists useful in the invention are generally prepared following known procedures. For example, a resist can be prepared as a coating composition by dissolving the components of the photoresist in a suitable solvent, for example, a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. Typically the solids content of the photoresist varies between about 2 and 25 wt % based on the total weight of the photoresist composition. Blends of such solvents also are suitable.

The methods of the invention can be used with a variety of imaging wavelengths, for example, radiation having a wavelength of sub-400 nm, sub-300 or sub-200 nm exposure wavelength, with I-line (365 nm), 248 nm and 193 nm being typical exposure wavelengths, as well as EUV (13.5 nm) and 157 nm. In an exemplary aspect, the photoresists are suitable for use with and imaged at a sub-200 nm wavelength such as 193 nm. At such wavelengths, the use of immersion lithography is typical although non-immersion processing can be used. In immersion lithography, a fluid (i.e., an immersion fluid) having a refractive index of between about 1 and about 2 is maintained between an exposure tool and the photoresist layer during exposure. A topcoat layer is typically disposed over the photoresist layer to prevent direct contact between the immersion fluid and photoresist layer to avoid leaching of components of the photoresist into the immersion fluid.

The photoresist composition can be applied to the substrate by spin-coating, dipping, roller-coating or other conventional coating technique. Of these, spin-coating is typical. For spin-coating, the solids content of the coating solution can be adjusted to provide a desired film thickness based upon the specific coating equipment utilized, the viscosity of the solution, the speed of the coating tool and the amount of time allowed for spinning A typical thickness for the photoresist layer 108 is from about 500 to 1500 Å. The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

If the photoresist layer 108 is to be exposed with an immersion lithography tool, for example a 193 nm immersion scanner, a topcoat layer (not shown) can be disposed over the photoresist layer 108. Use of such a topcoat layer can act as a barrier between the immersion fluid and underlying photoresist layer. In this way, leaching of components of the photoresist composition into the immersion fluid, possibly resulting in contamination of the optical lens and change in the effective refractive index and transmission properties of the immersion fluid, can be minimized or avoided. Suitable topcoat compositions are commercially available, for example, OPTICOAT™ topcoat materials such as OC™ 2000 (Rohm and Haas Electronic Materials) and are otherwise known in the art, for example, those described in U.S. Patent Application Pub. Nos. 2006/0246373A1 and 2010/0183977A1. Such compositions can be applied over the photoresist layer by any suitable method such as described above with reference to the photoresist compositions, with spin coating being typical. The topcoat layer thickness is typically λ/4n (or an odd multiple thereof), wherein λ is the wavelength of the exposure radiation and n is the refractive index of the topcoat layer. If a topcoat layer is present, the photoresist layer 108 can be softbaked after the topcoat layer composition has been applied rather than prior to topcoat application. In this way, the solvent from both layers can be removed in a single thermal treatment step.

The photoresist layer 108 is next exposed to activating radiation 110 through a first photomask 112 to create a difference in solubility between exposed and unexposed regions. The photomask has optically transparent and optically opaque regions 113, 114 corresponding to regions of the photosensitive layer to remain and be removed, respectively, in a subsequent development step. The exposure energy is typically from about 20 to 80 mJ/cm$^2$, dependent upon the exposure tool and the components of the photosensitive composition. References herein to exposing a photoresist composition to radiation that is activating for the composition indicates that the radiation is capable of forming a latent image in the photoresist composition. The photosensitive compositions are typically photoactivated by a short exposure wavelength, particularly a sub-400 nm, sub-300 or sub-200 nm exposure wavelength, with I-line (365 nm), 248 nm and 193 nm being typical exposure wavelengths, as well as EUV (13.5 nm) and 157 nm.

Figure 1B:
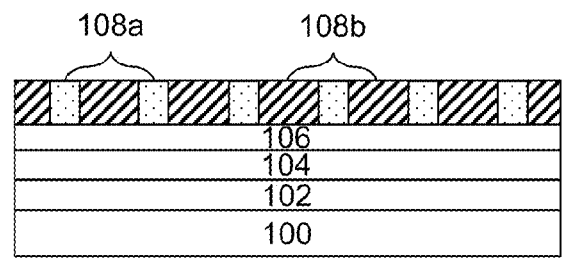

As shown in FIG. 1B, the exposed resist layer is made up of unexposed and exposed regions 108a, 108b. Following exposure of the photoresist layer 108, a post-exposure bake (PEB) is typically performed at a temperature above the softening point of the layer. The PEB can be conducted, for example, on a hotplate or in an oven. Conditions for the PEB will depend, for example, on the particular material of the photoresist layer and thickness. The PEB is typically conducted at a temperature of from about 80 to 150° C., and a time of from about 30 to 90 seconds.

Figure 1C:
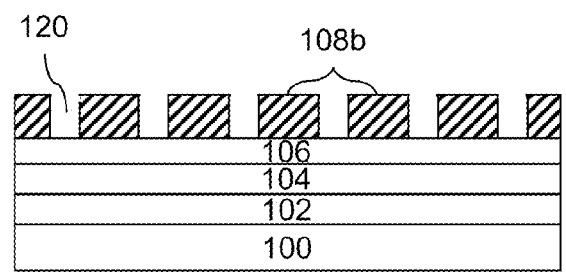

The exposed photoresist layer is next developed to remove unexposed regions 108a, leaving exposed regions 108b forming a resist pattern as shown in FIG. 1C. The developer comprises 2-heptanone, 5-methyl-2-hexanone or a combination thereof 2-heptanone and 5-methyl-2-hexanone have relatively high flashpoints of 39° C. and 40° C., respectively, thereby avoiding problems associated with flammability of materials such as n-butyl acetate. The developer can take the form of 2-heptanone or 5-methyl-2-hexanone, or a combination of either or both materials with other developers and/or additives. The 2-heptanone or 5-methyl-2-hexanone can be present as a substantially pure material, for example, in an amount greater than 95 wt %, greater than 98 wt % or greater than 99 wt %, based on the total weight of the developer. In the case the 2-heptanone and/or 5-methyl-2-hexanone are used in combination with another developer solvent, the boiling points of the solvents are preferably similar. Suitable additional solvents include, for example, ethylene glycol monomethyl ether, ethyl lactate, ethyl 3-ethoxy propionate, methyl-ethyl ketone, cyclohexanone or a solvent used in the photoresist composition. The 2-heptanone and/or 5-methyl-2-hexanone are typically present in the developer in a combined amount of from 50 wt % to 100 wt %, more typically from 80 wt % to 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer can be applied to the substrate by known techniques, for example, by spin-coating or puddle-coating. The development time is for a period effective to remove the unexposed regions of the photoresist, with a time of from 5 to 30 seconds being typical, and is typically conducted at room temperature.

Preferably, the development process can be conducted without use of a cleaning rinse following development. In this regard, it has been found that the development process can result in a residue-free wafer surface rendering such extra rinse step unnecessary.

Figure 1D:
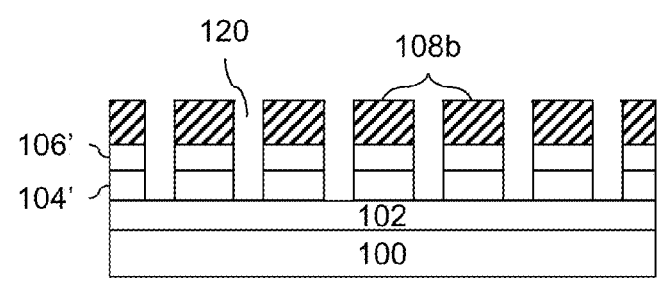

The BARC layer 106, if present, is selectively etched using resist pattern 108b as an etch mask, exposing the underlying hardmask layer 104, as shown in FIG. 1D. The hardmask layer is next selectively etched, again using the resist pattern 108b as an etch mask, resulting in patterned BARC and hardmask layers 106', 104'. Suitable etching techniques and chemistries for etching the BARC layer and hardmask layer are known in the art and will depend, for example, on the particular materials of these layers. Dry-etching processes such as reactive ion etching are typical. The resist pattern 108b and patterned BARC layer 106' are next removed from the substrate using known techniques, for example, oxygen plasma ashing.

Figure 1E:
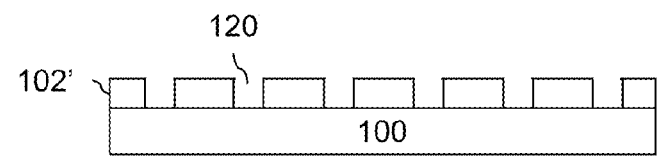

Using the hardmask pattern 104' as an etch mask, the one or more layers 102 are selectively etched. Suitable etching techniques and chemistries for etching the underlying layers 102 are known in the art, with dry-etching processes such as reactive ion etching being typical. The patterned hardmask layer 104' can next be removed from the substrate surface using known techniques, for example, a dry-etching process such as reactive ion etching. The resulting structure is a pattern of etched features 102' as illustrated in FIG. 1E. In an alternative exemplary method, it may be desirable to pattern the layer 102 directly using the resist pattern 108b without the use of a hardmask layer 104. Whether direct patterning is employed will depend on factors such as the materials involved, resist selectivity, resist pattern thickness and pattern dimensions.

A further exemplary aspect of the invention will be described with reference to FIG. 2A-F, which illustrates a process flow for forming contact holes using a double exposure photolithography process. This process is a variation of the technique described with reference to FIG. 1, but using an additional exposure of the photoresist layer in a different pattern than the first exposure. Except as otherwise stated, the description above with respect to FIG. 1 is also applicable to the process flow of FIG. 2.

As shown in FIG. 2A, the photoresist layer 108 is exposed to actinic radiation through photomask 112 in a first exposure step. Photomask 112 as shown includes a series of parallel lines forming the opaque regions 114 of the mask. Following the first exposure, a second exposure of the photoresist layer 108 is conducted through a photomask 116 as depicted in FIG. 2B. The second photomask 116 includes a series of lines in a direction perpendicular to those of the first photomask. This pattern can be made simply by rotating the first photomask 90°. The resulting photoresist layer includes unexposed regions 108a, once-exposed regions 108b and twice-exposed regions 108c, as shown in FIG. 2C.

Following the second exposure, the photoresist layer is post-exposure baked, typically at a temperature of from about 80 to 150° C., and a time of from about 30 to 90 seconds. The photoresist layer is next developed, using a developer as described above, to remove unexposed regions 108a, leaving once- and twice-exposed regions 108b, 108c to form a resist pattern as shown in FIG. 2D.

The resulting structure can next be patterned as described above with reference to FIG. 1, as shown in FIGS. 2E and 2F. The resulting structure is a pattern of etched features 120 as illustrated in FIG. 2F. This method is particularly suited to formation of contact holes in the manufacture of electronic devices.

EXAMPLES

Comparative Example

A 300 mm silicon wafer was spin-coated with AR™40A antireflectant (Rohm and Haas Electronic Materials) to form a first bottom antireflective coating (BARC) on a TEL CLEAN TRACK™ LITHIUS™ i+ coater. The wafer was baked for 60 seconds at 215° C., yielding a first BARC film thickness of 75 nm. A second BARC layer was next coated over the first BARC using AR™124 antireflectant (Rohm and Haas Electronic Materials), and was baked at 205° C. for 60 seconds to generate a 23 nm top BARC layer. EPIC™2389 photoresist (Rohm and Haas Electronic Materials) was next coated on the dual BARCs and soft-baked at 100° C. for 60 seconds on the coater to provide a resist film thickness of 110 Å. The resist layer was next coated with OC™2000 topcoat material (Rohm and Haas Electronic Materials) and exposed through a 6% attenuated-phase shift post mask having 83 nm mask CD (critical dimensions) with a target size of 60 nm at 110 nm pitch using an ASML TWINSCANT™ XT:1900i immersion scanner with a numerical aperture of 1.20 and under annular illumination conditions (0.96 outer sigma/0.69 inner sigma with XY-polarization) at various exposure doses between 22.5 and 61.5 mJ/cm² in increments of 1.3 mJ/cm². The wafer was then post-exposure baked (PEB) at 100° C. for 60 seconds. The imaged resist layer was next developed for 25 seconds using an n-butyl acetate developer. The wafer was rinsed with 1-hexanol (Sigma-Aldrich) for 15 seconds. The resulting theoretical structure can be seen in FIG. 3, in which d is the contact hole diameter and p is contact hole pitch.

Top-down images were next made as shown in FIG. 4 and CDs were measured on a Hitachi CG 4000 SEM (Hitachi High Technologies America, Inc) for each exposure dose/die. The exposure dose providing the target CD of 60 nm was 36.80 mJ/cm². At this target CD condition, contact holes of varying size and missing hole patterns were observed. CD uniformity (3σ) of the die meeting target CD was calculated by the SEM as 8.35 based on approximately 170 contact hole CD measurements within the die. Exposure latitude, indicative of process window and defined as the extent to which the photoresist as developed can be over- or underexposed and still achieve an acceptable result, was calculated. For this purpose, a range of exposure energies allowing a ±10% variation from target CD was used for the calculation according to the following formula:

$$EL = 100(ED_{lower} - ED_{upper})/ED_{target}$$

wherein EL is exposure latitude, $ED_{lower}$ is the exposure dose at the lower (−10%) CD limit, $ED_{upper}$ is the exposure dose at the upper (+10%) CD limit, and $ED_{target}$ is the exposure dose at the target CD. The calculated exposure latitude was 13%. These results and other data and observations are provided in Table 1, below.

Example 1

The procedures of Comparative Example 1 were repeated except substituting 5-methyl-2-hexanone for the n-butyl acetate developer. The exposure dose providing the target CD of 60 nm (61.25 nm as measured) was 39.40 mJ/cm². At this condition, accurate patterning of the contact holes with uniform size and shape resulted. The resulting exposure latitude was 15% and CD uniformity (3σ) was 7.22.

Example 2

The procedures of Comparative Example 1 were repeated except substituting 2-heptanone for the n-butyl acetate developer. The post-development visual inspection indicated no residue on the surface of the wafer. The exposure dose providing the target CD of 60 nm (60.73 nm as measured) was 51.10 mJ/cm². At this condition, accurate patterning of the contact holes with uniform size and shape resulted. The resulting exposure latitude was 32% and CD uniformity (3σ) was 7.07.

TABLE 1

|  | Comp. Ex. | Ex. 1 | Ex. 2 |
| --- | --- | --- | --- |
| Developer | n-Butyl Acetate | 5-Methyl-2-Hexanone | 2-Heptanone |
| Dose (mJ/cm2)/CD (nm) | 36.80/60.72 | 39.40/61.25 | 51.10/60.73 |
| CD Uniformity (3σ) | 8.35 | 7.22 | 7.07 |
| Exposure Latitude (%) | 13 | 15 | 32 |
| Flash Point (° C.) | 22 | 40 | 39 |
| NFPA 704* | 2, 3, 0 | 1, 2, 0 | 2, 2, 0 |

*Safety standard maintained by the National Fire Protection Association (U.S.). Each of health, Flammability and reactivity is rated on a scale from 0 (no hazard; normal substance) to 4 (severe risk).

What is claimed is:

1. A method of forming a photolithographic pattern, comprising:
    (a) providing a substrate comprising over a surface thereof one or more layer to be patterned;
    (b) applying a layer of a photoresist composition over the one or more layer to be patterned, the photoresist composition comprising: a resin comprising an acid cleavable leaving group; and an acid generator;
    (c) patternwise exposing the photoresist composition layer to actinic radiation; and
    (d) applying a developer to the photoresist composition layer, wherein unexposed portions of the photoresist layer are removed by the developer, leaving a photoresist pattern over the one or more layer to be patterned, wherein the developer comprises 2-heptanone.

2. The method of claim 1, further comprising transferring the pattern of the photoresist pattern to one or more layer underlying the photoresist mask, wherein the pattern transfer is conducted by an etching process, and wherein the method is free of a post-development rinse between applying the developer and the etching process.

3. The method of claim 1, further comprising performing a second patternwise exposure of the photoresist composition layer to actinic radiation after the first patternwise exposure and before applying the developer, wherein a pattern of the second patternwise exposure is different from a pattern of the first patternwise exposure.

4. The method of claim 1, wherein the developer comprises a mixture of solvents.

5. The method of claim 1, wherein the acid cleavable leaving group is chosen from ester groups containing a tertiary non-cyclic alkyl carbon or a tertiary alicyclic carbon covalently linked to the carboxyl oxygen of the ester.

6. The method of claim 1, wherein the acid cleavable leaving group is an acetal group.

7. The method of claim 1, wherein the photoresist composition is chemically amplified and undergoes a photoacid-promoted deprotection reaction of the acid labile groups to render the exposed portions of the photoresist layer more soluble in an alkaline aqueous developer than unexposed portions of the photoresist layer.

8. The method of claim 1, wherein the photoresist composition is positive-acting if developed in an alkaline aqueous developer, and negative-acting if developed in 2-heptanone developer.

9. The method of claim 1, wherein the resin further comprises functional groups that impart alkaline aqueous developability to the resist composition.

10. The method of claim 9, wherein the functional groups are chosen from polar functional groups.

11. The method of claim 10, wherein the polar functional groups are chosen from hydroxyl and carboxylate groups.

12. A method of forming a photolithographic pattern, comprising:
   (a) providing a substrate comprising over a surface thereof one or more layer to be patterned;
   (b) applying a layer of a photoresist composition over the one or more layer to be patterned, the photoresist composition comprising a resin comprising an acid cleavable leaving group and an acid generator;
   (c) patternwise exposing the photoresist composition layer to actinic radiation; and
   (d) applying a developer to the photoresist composition layer, wherein unexposed portions of the photoresist layer are removed by the developer, leaving a photoresist pattern over the one or more layer to be patterned, wherein the developer comprises 5-methyl-2-hexanone.

13. The method of claim 12, further comprising transferring the pattern of the photoresist pattern to one or more layer underlying the photoresist mask, wherein the pattern transfer is conducted by an etching process, and wherein the method is free of a post-development rinse between applying the developer and the etching process.

14. The method of claim 12, further comprising performing a second patternwise exposure of the photoresist composition layer to actinic radiation after the first patternwise exposure and before applying the developer, wherein a pattern of the second patternwise exposure is different from a pattern of the first patternwise exposure.

15. The method of claim 12, wherein the developer comprises a mixture of solvents.

16. The method of claim 12, wherein the acid cleavable leaving group is chosen from ester groups containing a tertiary non-cyclic alkyl carbon or a tertiary alicyclic carbon covalently linked to the carboxyl oxygen of the ester.

17. The method of claim 12, wherein the acid cleavable leaving group is an acetal group.

18. The method of claim 12, wherein the photoresist composition is chemically amplified and undergoes a photoacid-promoted deprotection reaction of the acid cleavable leaving group to render the exposed portions of the photoresist layer more soluble in an alkaline aqueous developer than unexposed portions of the photoresist layer.

19. The method of claim 12, wherein the photoresist composition is positive-acting if developed in an alkaline aqueous developer, and negative-acting if developed in 2-heptanone developer.

20. The method of claim 12, wherein the resin further comprises functional groups that impart alkaline aqueous developability to the resist composition.

* * * * *